United States Patent [19]

Shih

[11] Patent Number: 4,622,083
[45] Date of Patent: Nov. 11, 1986

[54] MOLECULAR BEAM EPITAXIAL PROCESS

[75] Inventor: Hung-Dah Shih, Plano, Tex.

[73] Assignee: Texas Instruments Incorporated, Dallas, Tex.

[21] Appl. No.: 710,199

[22] Filed: Mar. 11, 1985

[63] Continuation-in-part of Ser. No. 697,302, Jan. 1, 1985.

[51] Int. Cl.⁴ .................. H01L 21/203; H01L 21/477
[52] U.S. Cl. .................. 148/175; 29/576 E; 148/DIG. 110; 148/DIG. 169; 156/610; 156/612; 156/614; 156/DIG. 70; 156/DIG. 103
[58] Field of Search ... 148/175, DIG. 110, DIG. 169; 29/576 E; 156/612, 610, 614, DIG. 103, DIG. 70

[56] References Cited

U.S. PATENT DOCUMENTS

| | | | |
|---|---|---|---|
| 3,974,002 | 8/1976 | Casey et al. | 148/175 |
| 4,058,430 | 11/1977 | Suntola et al. | 148/DIG. 25 |
| 4,233,092 | 11/1980 | Harris et al. | 148/175 |
| 4,330,360 | 5/1982 | Kubiak et al. | 148/DIG. 169 |
| 4,368,098 | 1/1983 | Manasevit | 156/614 X |
| 4,383,872 | 5/1983 | Roberts | 148/175 |
| 4,470,192 | 9/1984 | Miller | 148/175 X |
| 4,493,142 | 1/1985 | Hwang | 148/175 X |

*Primary Examiner*—William G. Saba
*Attorney, Agent, or Firm*—Carlton H. Hoel; James T. Comfort; Melvin Sharp

[57] ABSTRACT

A molecular beam epitaxial growth process, for growth of III–V compounds, wherein a substrate is heated approximately to growth temperature before the group III cell is fully heated. That is, for example, to grow gallium arsenide, the arsenic cell would be heated, the arsenic cell's shutter opened, and the substrate heated up to growth temperature (e.g. 600 C), before the gallium cell is heated up. After the gallium cell is heated up, its shutter is opened, and epitaxial growth proceeds.

6 Claims, 2 Drawing Figures 4,622,083

MOLECULAR BEAM EPITAXIAL PROCESS

BACKGROUND AND SUMMARY OF INVENTION

The present invention relates to processes for epitaxial growth of semiconductor layers.

Molecular beam epitaxy (MBE) is an extremely important technique whereby layers of semiconductors (or indeed of dielectrics or of metals) can be custom tailored with extremely sharp transitions between layers. This is useful not only in producing heterojunctions, such as between gallium arsenide and aluminum gallium arsenide, but can be used to produce a wide variety of exotic structures. Molecular beam epitaxy is an extremely versatile fabrication technique, and is essential to creation of a tremendous variety of inovative device structures.

A particularly important area of application of MBE techniques is in III–V device structures. Interfaces between III–V compound semiconductors are often of very good quality, and pairs of semiconductors exist within this family which have nearly perfect lattice match but very different band gaps (such as gallium arsenide and AlGaAs), so that this family of materials is extremely attractive for fabrication of various device structures which make use of heterojunctions or other applications of pseudo-potentials, i.e. of the changing potential energy profiles for a carrier which are produced by changes in the band gap of the material in a direction which the carrier might travel.

However, useful as MBE techniques are in research, fruition of their full promise has been prevented by the difficulties of growth-related surface defects. The present invention is aimed at reducing the defect density produced by prior art techniques for MBE growth of III–V epitaxial layers.

For molecular beam epitaxy growth generally, a very clean wafer is suspended facing downward in an ultra-high vacuum chamber. The vacuum used is preferably 1E(−10) Torr or less. The wafer is typically held facing in a generally downward direction, to minimize particles falling on its surface, and two or more effusion cells (which are tiny furnaces with shutters, containing a pure source of one element) are heated and opened, so that atoms escaping the hot effusion source impinge on the surface of the substrate. The substrate is heated by a heater to a high enough temperature that atoms which impinge on its surface can move around to find an energetically favorable site. These energetically favorable sites will, for a clean crystalline wafer, be sites which correspond to the existing lattice, and thus epitaxial growth can occur.

In MBE growth of III–V compound semiconductors, it is strictly the flux of the group III element (e.g. aluminum, gallium, or indium) which limits the growth rate. This is because the vapor pressures of the group V elements (e.g. phosphorus or arsenic) are typically quite high at the temperatures required for epitaxial growth of crystalline semiconductor layers. Thus, to avoid outgassing of the group V element from the surface layer already in place on the wafer on which growth is proceeding, the vapor pressure at the group V element must be kept high enough to maintain equilibrium at the wafer's growth interface. Thus a very high density of group V atoms is continually impinging on the surface of the substrate, but, unless these atoms find a group V-deficient site (e.g. an adsorbed group III adatom), they will rapidly be desorbed from the wafer surface.

The present invention teaches that a major source of defects in MBE growth is deposition of cold group III atoms which have leaked around the shutter of the group III effusion cell before the substrate has been heated up to growth temperature. Thus, the present invention teaches that the substrate should be heated all (or nearly all) the way up to growth temperature before the group III effusion cell is fully heated. Thus, any group III atoms which leak out around the shutter of the group III effusion cell and thence impinge on the substrate surface will have enough mobility to find energetically favorable sites, i.e., sites which extend the lattice.

This problem of leakage becomes a particular difficulty when larger size wafers are used, because then, to achieve reasonably uniform rates of deposition of the group III element across the wafer surface, it will typically be necessary (for the same effusion cell type) to position the effusion cell farther from the wafer surface and run the cell at a higher temperature to provide the needed flux. However, the substantially higher temperature within the effusion cell means that leakage out around the shutter of the effusion cell is more likely.

It has not been recognized in the prior art that the sequence of heating the substrate before heating the group III effusion cell is of any criticality whatsoever. Nevertheless, the present invention teaches that this sequence of steps is critical, and that the density of defects in MBE-grown material is thereby reduced substantially. Moreover, this sequencing of steps is particularly desirable when the group III element in question is a metal which will be liquid at the growth temperature, since such low-temperature melting metals (indium and gallium) present particular problems with growth-related surface defect formation.

According to the present invention there is provided: A method for growing epitaxial layers consisting essentially of III–V semiconductor material, comprising the steps of: providing a crystalline substrate; suspending said substrate in an ultra-high vacuum facing a plurality of effusion cells; heating at least one of said effusion cells containing a group V element to provide a vapor pressure of said group V element at the surface of said substrate which is approximately in equilibrium with a group V component of the surface of said substrate at a predetermined growth temperature; heating said substrate to at least ⅔ of said growth temperature in degrees Kelvin; heating another one of said effusion cells containing a group III element to a predetermined growth effusion temperature; opening the shutter of said group III effusion cell while maintaining said substrate at said predetermined growth temperature, whereby epitaxial growth occurs on said substrate; wherein none of said effusion cells containing a group III element is heated hotter than 100 degrees C. below said growth effusion temperature before said substrate is heated.

BRIEF DESCRIPTION OF THE DRAWINGS

The present invention will be described with reference to the accompanying drawings, wherein.

DESCRIPTION OF THE PREFERRED EMBODIMENTS

The present invention will be described with reference to a particular sample MBE machine, and a particular compound semiconductor composition used for epitaxial growth. However, the present invention is also applicable to any MBE machine, and is also applicable to a tremendous variety of group III-V binary, ternary, and quaternary semiconductor layer compositions. That is, the present invention indicates that, in growing gallium arsenide, the gallium cell should be fully heated only after the substrate is heated, but the present invention also indicates that, in growing gallium indium arsenide phosphite, neither the gallium cell nor the indium cell should be fully heated until after the substrate has been heated; that, in growing AlGaAs, neither the aluminum cell nor the gallium cell should be fully heated until after the substrate has been heated; that in growing indium antimonide, the indium cell should not be fully heated until after the substrate has been heated; and the present invention also teaches an analogous limitation where other compounds consisting essentially of a III-V compound semiconductor are being grown. The present invention also teaches an analogous limitation where other crystalline compounds (including compound semiconductors or other compound materials) containing gallium or indium or other group III elements are being grown by MBE.

Figure 1:
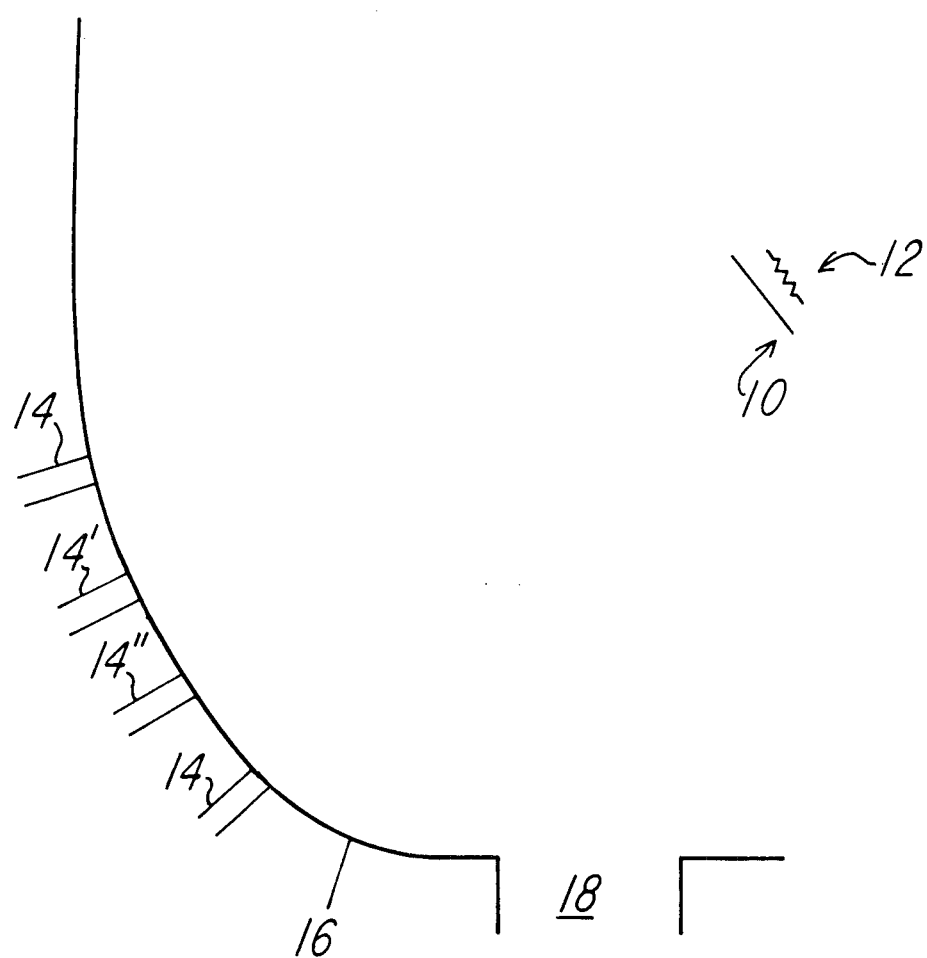
FIG. 1 shows schematically a sample MBE system.
Figure 2:
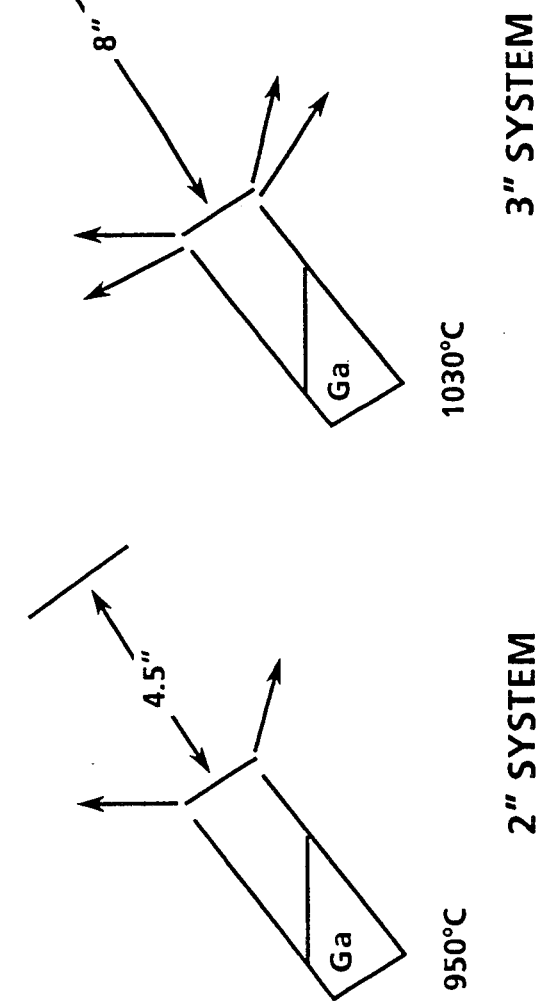
FIG. 2 shows schematically the higher effusion cell temperatures needed as MBE systems are used to grow larger diameter wafers.
Figure 2:
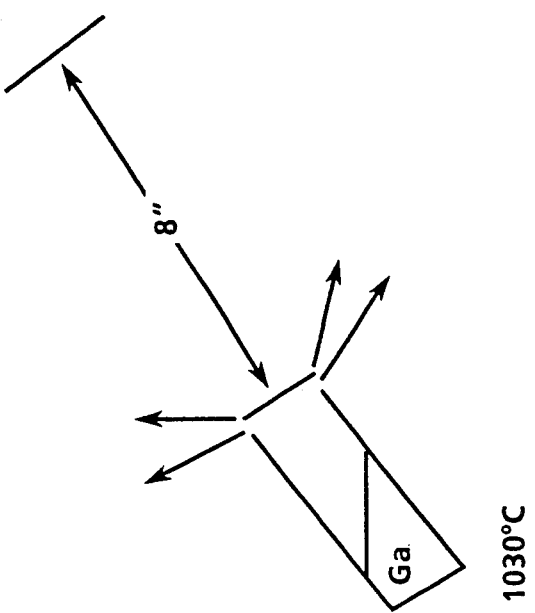

FIG. 1 shows a sample MBE system, wherein a wafer 10 is supported (with a wafer heater 12 adjacent to its back) facing a plurality of effusion sources 14 within an ultra-high vacuum chamber 16. A vacuum pump outlet 18 keeps the chamber 16 evacuated.

In a sample embodiment of the present invention, using a Riber MBE system, for growing a gallium arsenide epitaxial layer on a gallium arsenide substrate, an arsenic effusion cell 14 prime is first heated to its operating temperature. Next, the shutter of the arsenic cell 14 prime is opened, so that the vapor pressure of arsenic in the chamber becomes approximately in equilibrium with GaAs at the growth temperature, although the background pressure in the chamber will be less than ten to the minus 10th Torr. Next, the substrate 10 is heated up to approximately the growth temperature, or 600 degrees in this example. Next, another effusion cell 14 double prime containing gallium is heated to 1030 degrees C., at which temperature it will produce a sufficient flux of gallium atoms for reasonably rapid epitaxial growth. At this point, a few gallium atoms will typically leak out of the effusion cell to establish a gallium vapor pressure of perhaps 10 to the −7th Torr at the surface of the wafer 10. The pressure of gallium atoms within the cell will be much higher, e.g. 10 to the −5th Torr, or higher. Finally, the shutter of the gallium cell 14 double prime is opened, and the heated substrate is now exposed to a flux of both gallium and arsenic atoms, so that gallium arsenide epitaxial growth will occur at a rate of roughly one micron per hour.

Various brands of effusion cells could be used, but the key teaching of the present invention is that the wafer should be heated, if not to the growth temperature then at least to a temperature much higher than room temperature, e.g. to more than two-thirds of the growth temperature in degrees Kelvin, before the group III effusion cell is heated to within 100 degrees C. below its operating temperature.

In the present invention, the gallium cell is held at 400 C. when the substrate is cold. This temperature is below the point where the vapor pressure of gallium rises sharply, but it is high enough that the condensation of contaminants in the gallium cell will be reduced, and the gallium cell can be heated to growth temperature quite rapidly, which may be desirable to achieve sharp heterojunctions.

Where a doped III-V compound semiconductor is being grown, one or more dopant effusion cells will also be operated during growth to provide a flux of dopant atoms. Nevertheless, the present invention is still applicable.

In the present invention the substrate is preferably heated all the way up to the growth temperature before the gallium cell is heated above 400 C., but a substantial part of the advantages of the invention is attained if the substrate is merely heated to a temperature somewhat near the growth temperature. For example, some of the advantages of the present invention would be attained if the substrate is heated to as little as two thirds of the absolute growth temperature, although so low a temperature is definitely not preferred.

Thus the present invention advantageously prevents condensation of non-epitaxial islands of group III material or of group III-V compound on the wafer's surface. More particularly, the present invention reduces the incidence of growth-related surface defects in material grown by molecular beam epitaxy. The present invention provides particular advantages of defect reduction when a semiconductor compound containing a significant fraction of indium or gallium is being grown.

The present invention can be widely modified and varied and is expressly not limited except as defined in the accompanying claims.

What is claimed is:

1. A method for growing epitaxial layers consisting essentially of III-V semiconductor material, comprising the steps of:

providing a crystalline substrate;

suspending said substrate in an ultra-high vacuum and facing a plurality of effusion cells;

heating at least one of said effusion cells containing a group V element while maintaining each of said effusion cells containing a group III element at a temperature at least 100 degrees C. below a growth effusion temperature for said cell, said heated effusion cell containing a group V element to provide a vapor pressure of said group V element at the surface of said substrate which is approximately in equilibrium with a group V component of the surface of said substrate at a predetermined growth surface temperature;

heating said substrate to at least ⅔ of said growth surface temperature in degrees Kelvin while maintaining all of said effusion cells containing group III elements at temperatures at least 100 degrees C. below growth effusion temperatures for said cells;

maintaining said substrate at said at least ⅔ of said growth surface temperature while heating another one of said effusion cells containing a group III element to a predetermined growth effusion temperature:

opening the shutter of said group III effusion cell while maintaining said substrate at said predetermined growth surface temperature, whereby epitaxial growth occurs on said substrate.

2. The process of claim 1, wherein said surface temperature is in the range between 400 and 700 degrees C.

3. The process of claim 1, wherein said group III effusion cell contains gallium.

4. The process of claim 3, wherein gallium cell is heated to a temperature of greater than about 1000 degrees C.

5. The process of claim 1, wherein said group V effusion cell contains an arsenic-cracking source.

6. The process of claim 1, wherein said ultra-high vacuum chamber is evacuated to a background pressure less than one times ten to the $-10$ Torr.

* * * * *